United States Patent
Cheng et al.

(10) Patent No.: US 10,115,858 B2
(45) Date of Patent: Oct. 30, 2018

(54) LIGHT EMITTING DIODE AND FABRICATION METHOD THEREOF

(71) Applicant: XIAMEN SAN'AN OPTOELECTRONICS CO., LTD., Xiamen (CN)

(72) Inventors: Chih-Ching Cheng, Xiamen (CN); Chan-Chan Ling, Xiamen (CN); Chia-Hung Chang, Xiamen (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 15/871,929

(22) Filed: Jan. 15, 2018

(65) Prior Publication Data

US 2018/0158982 A1 Jun. 7, 2018

Related U.S. Application Data

(63) Continuation of application No. PCT/CN2017/087713, filed on Jun. 9, 2017.

(30) Foreign Application Priority Data

Jul. 19, 2016 (CN) .......................... 2016 1 0565314

(51) Int. Cl.
| | |
|---|---|
| H01L 33/04 | (2010.01) |
| H01L 33/02 | (2010.01) |
| H01L 33/00 | (2010.01) |
| H01L 33/32 | (2010.01) |
| H01L 33/24 | (2010.01) |

(52) U.S. Cl.
CPC .............. H01L 33/04 (2013.01); H01L 33/00 (2013.01); H01L 33/0075 (2013.01); H01L 33/02 (2013.01); H01L 33/025 (2013.01); H01L 33/24 (2013.01); H01L 33/32 (2013.01)

(58) Field of Classification Search
CPC ......... H01L 33/04; H01L 33/00; H01L 33/24; H01L 33/02; H01L 33/32; H01L 33/0075; H01L 33/025

See application file for complete search history.

(56) References Cited

U.S. PATENT DOCUMENTS 6,518,602 B1 * 2/2003 Yuasa ................... H01L 33/325
257/102

FOREIGN PATENT DOCUMENTS

CN 104393124 A 3/2015

* cited by examiner

*Primary Examiner* — David Vu
(74) *Attorney, Agent, or Firm* — Syncoda LLC; Feng Ma; Junjie Feng

(57) ABSTRACT

A method of fabricating a light emitting diode includes providing a substrate, and forming successively an N-type layer, an active layer, an electronic blocking layer, and a P-type layer over the substrate. The P-type layer includes a Mg-doped GaN material layer having a Mg impurity concentration of about $2\times10^{19}$-$2\times10^{20}$ cm$^{-3}$; and has a thickness of less than or equal to about 250 Å, and has a surface density of V-type defects of less than or equal to about $5\times10^{6}$ cm$^{-2}$. Through these optimized growth conditions for the P-type layer, the light absorption of the P-type layer can be reduced, the electric leakage due to the relatively large density of V-type defects on the surface can be reduced, and the anti-static capacity of the light emitting diode fabricated thereby can be improved.

20 Claims, 7 Drawing Sheets

LIGHT EMITTING DIODE AND FABRICATION METHOD THEREOF

CROSS-REFERENCE TO RELATED APPLICATIONS

The present application is a continuation of, and claims priority to, PCT/CN2017/087713 filed on Jun. 9, 2017, which claims priority to Chinese Patent Application No. 201610565314.5 filed on Jul. 19, 2016. The disclosures of these applications are hereby incorporated by reference in their entirety.

BACKGROUND

GaN-based materials, including InGaN, GaN and AlGaN alloys, are direct gap semiconductors with band gap continuously adjustable from 1.8 to 6.2 eV. Thanks to wide direct gap, strong chemical bond and resistance to high temperature and corrosion, GaN-based materials are ideal for producing light-emitting devices with short wavelengths and high luminance, and are widely applied in fields like full color screen display, LCD backlight source, signal light and lighting.

SUMMARY

The inventors of the present disclosure have recognized that the light emitting efficiency of the GaN-based LED can be improved by two ways: one is to improve internal quantum efficiency, and the other is to improve external quantum efficiency. At present, an important factor restricting the improvement of internal quantum efficiency is the hole concentration of the P layer injection in the active region. As the hole concentration of the P layer is influenced by the doping efficiency and ionization efficiency of Mg in the GaN, it is difficult to achieve high activation level of Mg doping concentration and hole concentration of the P layer, resulting in less holes injected in the active region.

In addition, holes are distributed unevenly, and mainly concentrated in the last 3-5 quantum wells, causing low internal quantum efficiency. Meanwhile, the relative thick P layer absorbs much light emitted from the quantum well layer.

However, in current technologies, if external quantum efficiency is improved solely by thinning the P layer, the V-type defect density of the epitaxial layer surface is bound to be large, causing serious electric leakage of device and poor anti-static electricity capacity.

To address the above defects of the current technologies, the present disclosure provides a method for fabricating a light emitting diode. The method includes:
providing a substrate;
forming an N-type layer over the substrate;
forming an active layer over the N-type layer;
forming an electronic blocking layer over the active layer; and
forming a P-type layer over the electronic blocking layer.

It is configured such that the P-type layer comprises a Mg-doped GaN material layer having a Mg impurity concentration of about $2\times10^{19}$-$2\times10^{20}$ cm$^{-3}$; and that the P-type layer has a thickness of less than or equal to about 250 Å, and has a surface density of V-type defects of less than or equal to about $5\times10^6$ cm$^{-2}$.

In the forming an electronic blocking layer over the active layer of the method, V-type defects on an upper surface of the electronic blocking layer can be configured to have an opening width of greater than or equal to about 50 nm, and a density of greater than or equal to about $1\times10^8$ cm$^{-2}$.

In the method, the forming a P-type layer over the electronic blocking layer can comprise:
growing the P-type layer such that a Mg/Ga mole ratio is greater than or equal to about 0.005, and a growth rate of the P-type layer is less than or equal to about 50 Å/min.

According to some embodiments of the method, in the forming a P-type layer over the electronic blocking layer, the P-type layer has a surface density of V-type defects of less than or equal to about $2.5\times10^6$ cm$^{-2}$. Accordingly, the forming a P-type layer over the electronic blocking layer comprises:
growing the P-type layer such that a Mg/Ga mole ratio is about 0. 0.005-0.02, and a growth rate of the P-type layer is less than or equal to about 20 Å/min.

According to one specific embodiment of the method, in the forming a P-type layer over the electronic blocking layer, the P-type layer has a thickness of about 100 Å, and has a surface density of V-type defects of less than or equal to about $1.8\times10^6$ cm$^{-2}$. Accordingly, the forming a P-type layer over the electronic blocking layer includes:
growing the P-type layer such that a Mg/Ga mole ratio is greater than or equal to about 0.005, and a growth rate of the P-type layer is less than or equal to about 15 Å/min.

In the method as described above, the forming a P-type layer over the electronic blocking layer comprises:
growing the P-type layer with an increased Mg/Ga mole ratio and a reduced growth rate to thereby obtain the P-type layer having a reduced surface density of V-type defects.

According to some embodiments, prior to the forming an electronic blocking layer over the active layer, the method further comprises: growing a low-temperature P-type GaN layer over the active layer. And accordingly, the growing an electronic blocking layer over the active layer comprises: growing an electronic blocking layer over the low-temperature P-type GaN layer.

Herein the forming an electronic blocking layer over the active layer can comprise:
successively forming a non-intentional doping AlGaN layer, a P-type AlGaN layer, and a P-AlGaN/GaN superlattice structure layer over the low-temperature P-type GaN layer.

In another aspect, the disclosure further provides a light emitting diode, which includes a substrate, and further includes an N-type layer, an active layer, an electronic blocking layer, and a P-type layer, successively over the substrate. It is configured such that the P-type layer comprises a Mg-doped GaN material layer, and that the P-type layer a thickness of less than or equal to about 250 Å, and a surface density of V-type defects of less than or equal to about $5\times10^6$ cm$^{-2}$.

According to some embodiments of the light emitting diode, V-type defects on an upper surface of the electronic blocking layer have a width of greater than or equal to 50 nm, and a density of greater than or equal to $1\times10^6$ cm$^{-2}$.

According to some embodiments of the light emitting diode, the P-type layer has a surface density of V-type defects of less than or equal to about $2.5\times10^6$ cm$^{-2}$.

According to one specific embodiment of the light emitting diode, the P-type layer has a thickness of about 100 Å, and has a surface density of V-type defects of less than or equal to about $1.8\times10^6$ cm$^{-2}$.

According to some embodiments, the light emitting diode can further include a low-temperature P-type GaN layer between the active layer and the electronic blocking layer, and the electronic blocking layer can further comprise a non-intentional doping AlGaN layer, a P-type AlGaN layer and a P-AlGaN/GaN superlattice structure layer, which are successively over the low-temperature P-type GaN layer.

In the light emitting diode P-type impurity of the P-type AlGaN layer can have a higher concentration than P-type impurity of the P-AlGaN/GaN superlattice structure layer.

The P-AlGaN/GaN superlattice structure layer can have a higher concentration of Al component than any one of the non-intentional doping AlGaN layer and the P-type AlGaN layer.

According to some embodiments of the light emitting diode, the non-intentional doping AlGaN layer has Al component of about 2-15%, the P-type AlGaN layer has Al component of about 2-15%, and the P-AlGaN/GaN superlattice structure layer has Al component of about 2-20%.

In the light emitting diode, the Mg-doped GaN material layer can have a Mg impurity concentration of about $2 \times 10^{19}$-$2 \times 10^{20}$ cm$^{-3}$.

In the light emitting diode, the non-intentional doping AlGaN layer can have a thickness of about 50-200 Å, the P-type AlGaN layer can have a thickness of about 100-400 Å, and the P-AlGaN/GaN superlattice structure layer can have a thickness of about 250-750 Å.

BRIEF DESCRIPTION OF THE DRAWINGS

The accompanying drawings, which are included to provide a further understanding of the invention and constitute a part of this specification, together with the embodiments, are therefore to be considered in all respects as illustrative and not restrictive. In addition, the drawings are merely illustrative, which are not drawn to scale.

DETAILED DESCRIPTION

The embodiments of the present disclosure will be described in detail with reference to the accompanying drawings and embodiments.

Figure 1:
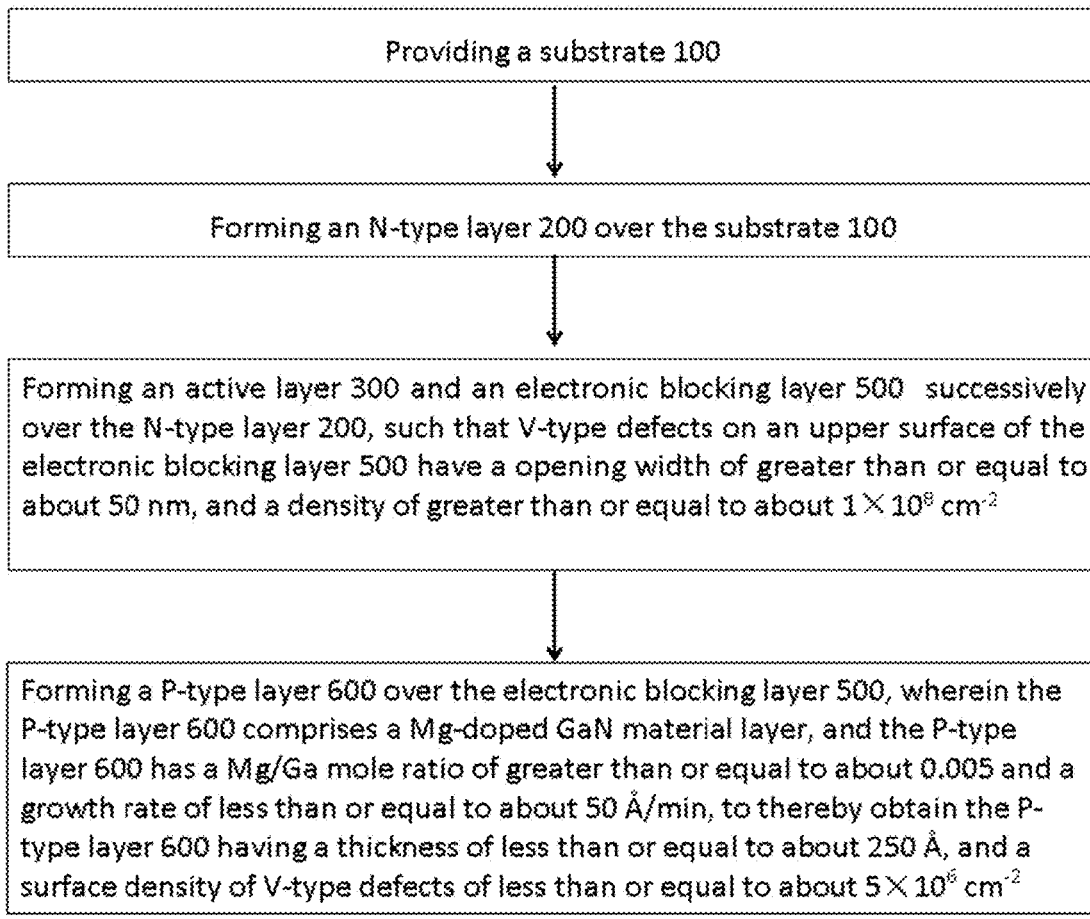
FIG. 1 is flow chart illustrating a method for fabricating a light emitting diode according to first embodiments of the disclosure.
Figure 2:
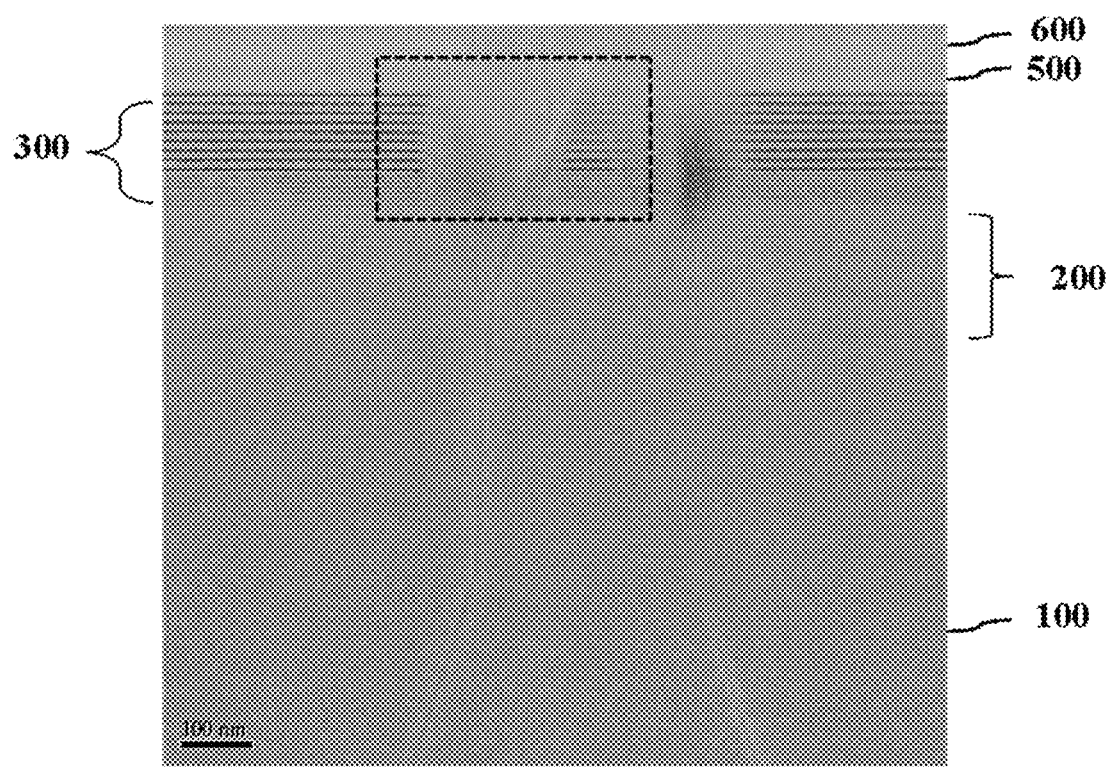
FIG. 2 is a scanning electron microscope (SEM) picture of a light emitting diode manufactured by the fabrication method according to the first embodiments of the disclosure.

Referring to FIGS. 1 and 2, the present disclosure provides a method for fabricating a light emitting diode according to first embodiments of the disclosure.

As shown in FIGS. 1 and 2, the first embodiments of the fabrication method substantially comprises:

Providing a substrate 100;

Forming an N-type layer 200 over the substrate 100;

Forming an active layer 300 over the N-type layer 200; and

Forming an electronic blocking layer 500 over the active layer 300.

As a testing analysis indicates, an upper surface of the electronic blocking layer 500 has a relatively large number of V-type defects. An opening width of the V-type defects is greater than or equal to about 50 nm, and a density of the V-type defects is greater than or equal to about $1 \times 10^8$ cm$^{-2}$.

Currently, a growing number of theoretical researches and experiment results prove that the V-type defects are important hole injection channels inside a GaN-based LED, which greatly improves the hole injection efficiency. However, if the density of the V-type defects on the surface of the LED is too high, a number of electric leakage channels can increase, which influences anti-static electricity capacity of the light emitting diode fabricated thereby.

The first embodiments of the fabrication method further include:

Forming a P-type layer 600 over the electronic blocking layer 500.

Optionally, the P-type layer 600 is a Mg-doped GaN material layer, and the Mg impurity concentration is about $2 \times 10^{19}$-$2 \times 10^{20}$ cm$^{-3}$. Specifically, when growing the P-type layer 600, the Mg/Ga mole ratio can be adjusted to be greater than or equal to about 0.005 and the growth rate can be less than or equal to about 50 Å/min, to thereby obtain the P-type layer 600 with a thickness of less than or equal to about 250 Å and with a surface density of V-type defects of less than or equal to about $5 \times 10^6$ cm$^{-2}$.

Preferably, the Mg/Ga mole ratio is about 0.005-0.02, and the growth rate is less than or equal to about 20 Å/min. The surface density of V-defects of the P-type layer 600 is less than or equal to about $2.5 \times 10^6$ cm$^{-2}$.

When the thickness of the P-type layer 600 is less than or equal to about 250 Å, the surface density of V-type defects decreases as the Mg/Ga mole ratio increases, and decreases as the growth rate decreases. Therefore, in this first embodiment of the fabrication method disclosed herein, through a low-rate growth of a highly Mg-doped P-type layer 600, a ratio between a horizontal growth rate and a vertical growth rate during an epitaxial growth can be increased so that the horizontal growth is prominent in epitaxy. As such, the V-type defects can be filled in even when the thickness of the P-type layer 600 is small.

Meanwhile, the Mg/Ga mole ratio is controlled to be greater than or equal to about 0.005. Because when the Mg/Ga mole ratio is relatively high, it is prone to form MgN through lateral growth, thus an extension of the V-type defects can be inhibited, resulting in an accelerated filling of the V-type defects. As such, a P-type layer 600 having a density of V-type defects on an upper surface thereof of less than or equal to about $5 \times 10^6$ cm$^{-2}$ can be fabricated. In turn, the light emitting efficiency of the device can be increased, while the electric leakage of the device can be reduced, and the anti-static electricity capacity can be improved.

Figure 3:
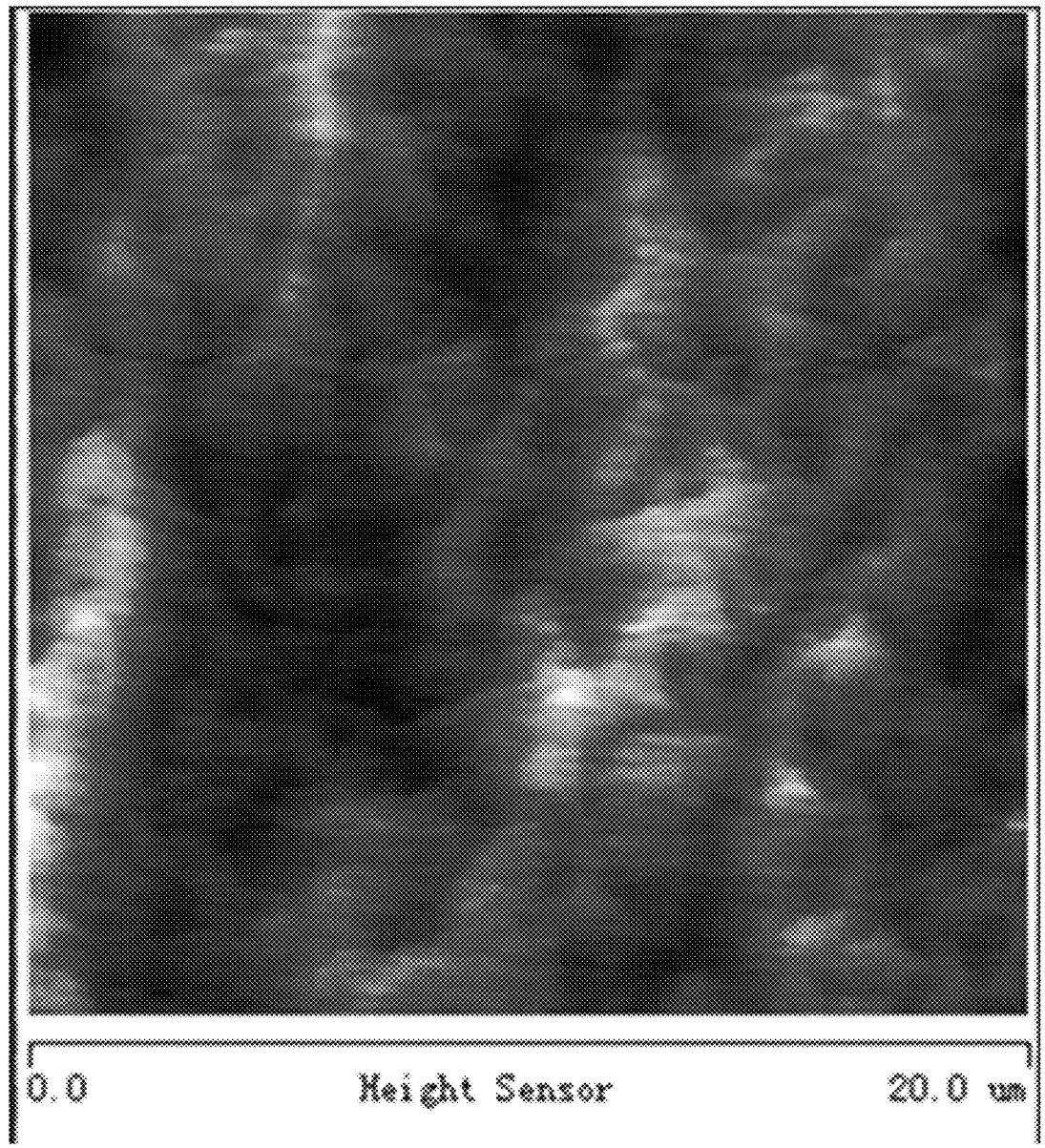
FIG. 3 is an AFM picture of a light emitting diode manufactured by one preferred first embodiment of the disclosure.

Further as shown in this embodiment as illustrated in FIG. 3, the growth rate of the P-type layer 600 is preferably about 15 Å/min, and the Mg/Ga mole ratio is about 0.005. Thereby, when the thickness of the P-type layer 600 is about 100 Å, a relatively flat surface can still be obtained. Specifically, the surface density of V-type defects of the P-type layer 600 is about $1.8 \times 10^6$ cm$^{-2}$.

Figure 4:
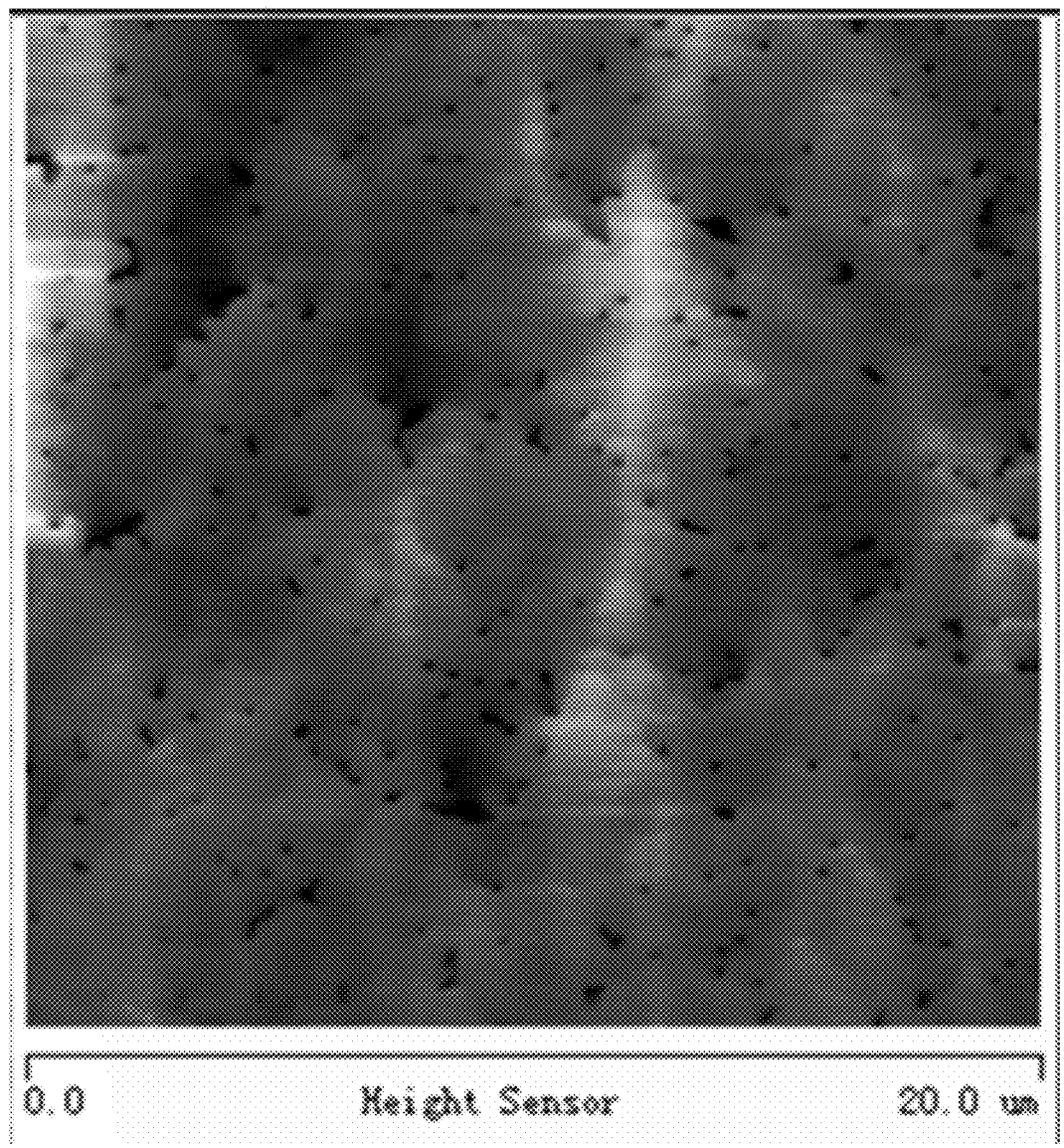
FIG. 4 is an AFM diagram of a light emitting diode manufactured by a control method provided by the disclosure.

The present disclosure also provides a control method. The difference between the control method and the preferred first embodiment of the method disclosed herein includes the growth conditions of the P-type layer 600. Specifically, in the control, the growth rate of the P-type layer 600 is 15 Å/min; the thickness thereof is about 100 Å, and the Mg/Ga mole ratio thereof is about 0.0035. As shown in the AFM diagram of FIG. 4, the surface has a relatively large number of pits. This is because when the Mg/Ga mole ratio is relatively small, the V-type defects on the electronic blocking layer 500 are yet to be completely filled in even when the growth rate is low and when the thickness of the P-type layer 600 is about 100 Å.

Figure 5:
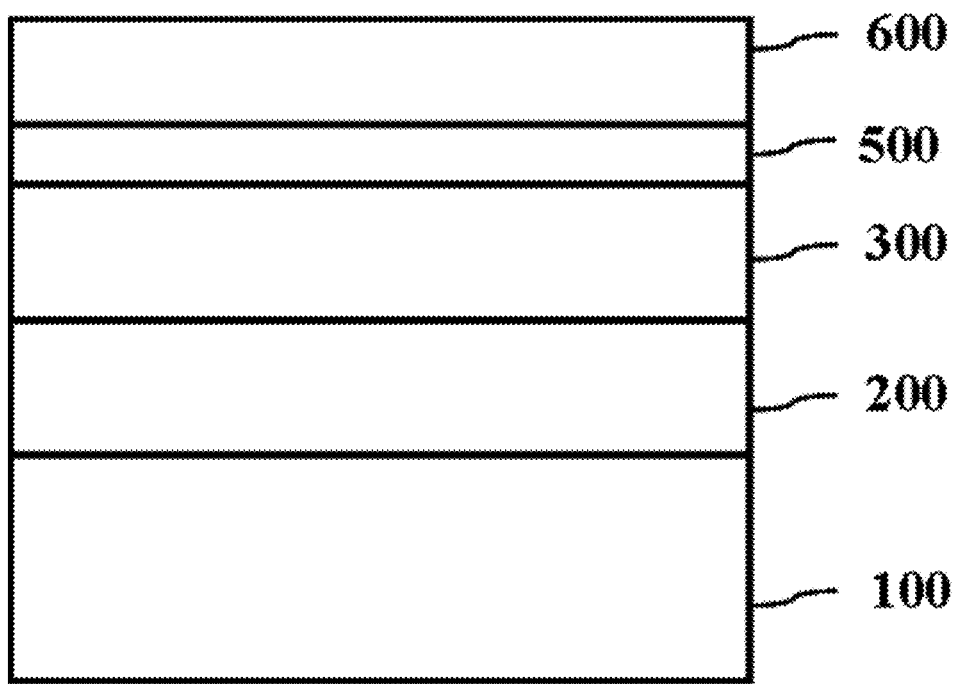
FIG. 5 is a structural diagram of a light emitting diode manufactured by the fabrication method according to a first embodiment of the disclosure.

With reference to FIG. 5, the present disclosure further provides a light emitting diode fabricated by the method as described above. The light emitting diode comprises a substrate 100. An N-type layer 200, an active layer 300, an electronic blocking layer 500, and a P-type layer 600 are successively disposed over the substrate 100.

In the light emitting diode, the P-type layer 600 is a Mg-doped GaN layer. An opening width of V-type defects on an upper surface of the electronic blocking layer 500 is greater than or equal to about 50 nm, and a density of V-type defects on the upper surface of the electronic blocking layer 500 is greater than or equal to about $1\times10^8$ cm$^{-2}$. A thickness of the P-type layer 600 is less than or equal to about 250 Å, and a density of V-type defects on an upper surface of the P-type layer 600 is less than or equal to about $5\times10^6$ cm$^{-2}$.

Figure 6:
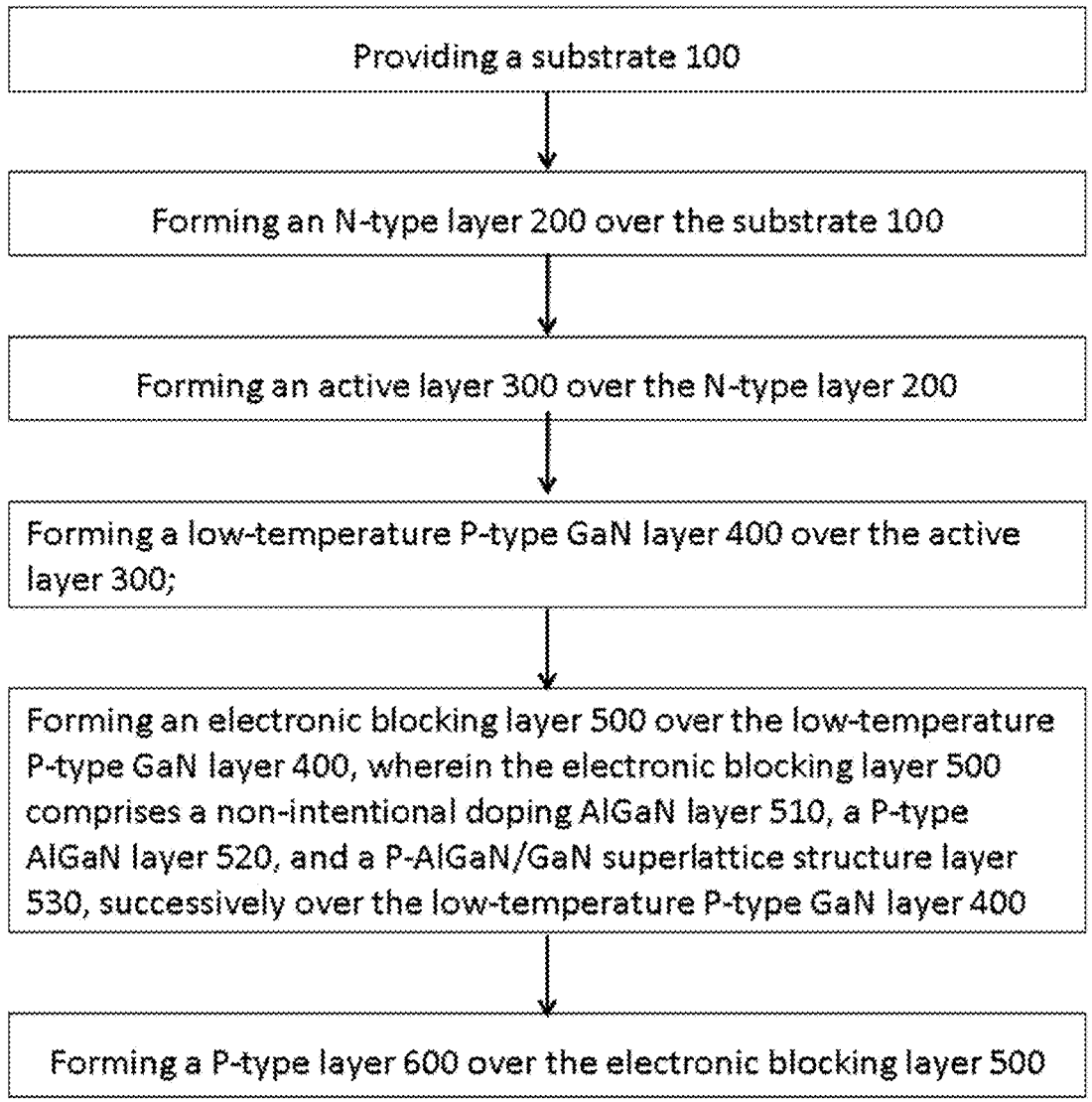
FIG. 6 is a flow chart illustrating a method for fabricating a light emitting diode according to a second embodiment of the present disclosure.
Figure 7:
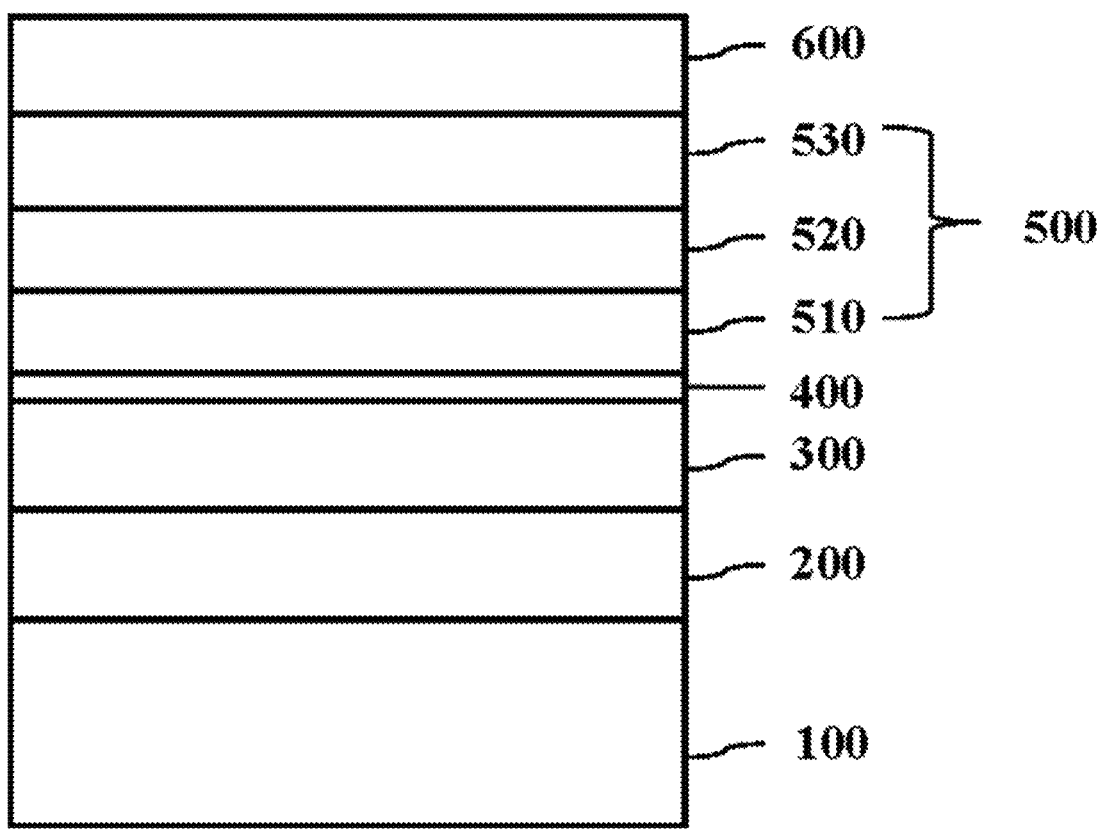
FIG. 7 is a schematic diagram of a light emitting diode manufactured by the fabrication method according to the second embodiment of the disclosure.

FIGS. 6 and 7 illustrate a fabrication method according to a second embodiment of the present disclosure. Compared with the first embodiment as described above, the second embodiment of the method includes:

forming a low-temperature P-type GaN layer 400 prior to the growing the active layer 300; and forming the electronic blocking layer 500 over the low-temperature P-type GaN layer 400.

The above steps in the second embodiment of the fabrication method as described above can further improve the performance of the light emitting diode fabricated thereby.

Herein in the light emitting diode as illustrated in FIG. 7, the electronic blocking layer 500 substantially comprises a non-intentional doping AlGaN layer 510, a P-type AlGaN layer 520, and a P-AlGaN/GaN superlattice structure layer 530, successively over the low-temperature P-type GaN layer 400.

In the light emitting diode fabricated by the second embodiment of the method, the low-temperature P-type GaN layer 400 is substantially sandwiched between the active layer 300 and the electronic blocking layer 500, which can protect a crystal quality of the active layer 300, in turn facilitating the injection of holes to the active layer 300 to thereby realize a fabrication of a GaN-based light emitting diode with a high light emitting intensity.

In this second embodiment of the fabrication method, the non-intentional doping AlGaN layer 510 is to prevent P-type impurities from extending to the active layer 300, which influences light emitting efficiency. As such, a non-intentional doping can be employed. The P-type doping concentration of the P-type AlGaN layer 520 is higher than that of the P-AlGaN/GaN superlattice structure layer 530, thus increasing a hole concentration and an injection efficiency of the electronic holes.

Meanwhile, an Al component of the P-AlGaN/GaN superlattice structure layer 530 is about 2-20%, an Al component of the non-intentional doping AlGaN layer 510 is about 2-15%, and an Al component of the P-type AlGaN layer 520 is about 2-15%. The Al component of the non-intentional doping AlGaN layer 510 and the Al component of the P-type AlGaN layer 520 are both relatively lower; and the P-AlGaN/GaN superlattice structure layer 530 with a relatively higher Al component has a relatively higher hole concentration and a relatively higher hole migration efficiency, thus the internal quantum efficiency of the epitaxial structure can be improved.

In the light emitting diode, the non-intentional doping AlGaN layer can have a thickness of about 50-200 Å, the P-type AlGaN layer can have a thickness of about 100-400 Å, and the P-AlGaN/GaN superlattice structure layer can have a thickness of about 250-750 Å.

To sum up, by thinning the P-type layer 600, various embodiments of the present disclosure can optimize growth conditions of the P-type layer 600. Through a low growth rate, a high Mg/Ga mole ratio and a high Mg doping, the P-type layer 600 can still fill in the V-type defects on the upper surface of the electronic blocking layer 500 even when the thickness thereof is small (i.e. less than or equal to about 250 Å), thus reducing light absorption of the P-type layer 600. Meanwhile, the electric leakage due to the relatively large density of V-type defects on the surface can be reduced, and anti-static capacity can be improved.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A method of fabricating a light emitting diode, the method comprising:

providing a substrate;

forming an N-type layer over the substrate;

forming an active layer over the N-type layer;

forming an electronic blocking layer over the active layer; and forming a P-type layer over the electronic blocking layer, wherein:

the P-type layer comprises a Mg-doped GaN material layer having a Mg impurity concentration of about $2\times10^{19}$-$2\times10^{20}$ cm$^{-3}$; and the P-type layer has a thickness of less than or equal to about 250 Å, and has a surface density of V-type defects of less than or equal to about $5\times10^6$ cm$^{-2}$.

2. The method of claim 1, wherein in the forming an electronic blocking layer over the active layer, V-type defects on an upper surface of the electronic blocking layer have an opening width of greater than or equal to about 50 nm, and a density of greater than or equal to about $1\times10^8$ cm$^{-2}$.

3. The method of claim 1, wherein the forming a P-type layer over the electronic blocking layer comprises:

growing the P-type layer such that a Mg/Ga mole ratio is greater than or equal to about 0.005, and a growth rate of the P-type layer is less than or equal to about 50 Å/min.

4. The method of claim 1, wherein in the forming a P-type layer over the electronic blocking layer, the P-type layer has a surface density of V-type defects of less than or equal to about $2.5\times10^6$ cm$^{-2}$.

5. The method of claim 4, wherein the forming a P-type layer over the electronic blocking layer comprises:

growing the P-type layer such that a Mg/Ga mole ratio is about 0. 0.005-0.02, and a growth rate of the P-type layer is less than or equal to about 20 Å/min.

6. The method of claim 5, wherein in the forming a P-type layer over the electronic blocking layer, the P-type layer has a thickness of about 100 Å, and has a surface density of V-type defects of less than or equal to about $1.8 \times 10^6$ cm$^{-2}$.

7. The method of claim 6, wherein the forming a P-type layer over the electronic blocking layer comprises:
growing the P-type layer such that a Mg/Ga mole ratio is greater than or equal to about 0.005, and a growth rate of the P-type layer is less than or equal to about 15 Å/min.

8. The method of claim 1, wherein the forming a P-type layer over the electronic blocking layer comprises:
growing the P-type layer with an increased Mg/Ga mole ratio and a reduced growth rate to thereby obtain the P-type layer having a reduced surface density of V-type defects.

9. The method of claim 1, wherein:
the method further comprises, prior to the forming an electronic blocking layer over the active layer:
growing a low-temperature P-type GaN layer over the active layer;
and
the growing an electronic blocking layer over the active layer comprises:
growing an electronic blocking layer over the low-temperature P-type GaN layer.

10. The method of claim 9, wherein the forming an electronic blocking layer over the active layer comprises:
successively forming a non-intentional doping AlGaN layer, a P-type AlGaN layer, and a P-AlGaN/GaN superlattice structure layer over the low-temperature P-type GaN layer.

11. A light emitting diode, comprising:
a substrate; and
an N-type layer, an active layer, an electronic blocking layer, and a P-type layer, successively over the substrate;
wherein:
the P-type layer comprises a Mg-doped GaN material layer; and
the P-type layer a thickness of less than or equal to about 250 Å, and a surface density of V-type defects of less than or equal to about $5 \times 10^6$ cm$^{-2}$.

12. The light emitting diode of claim 11, wherein V-type defects on an upper surface of the electronic blocking layer have a width of greater than or equal to 50 nm, and a density of greater than or equal to $1 \times 10^8$ cm$^{-2}$.

13. The light emitting diode of claim 11, wherein the P-type layer has a surface density of V-type defects of less than or equal to about $2.5 \times 10^6$ cm$^{-2}$.

14. The light emitting diode of claim 13, wherein the P-type layer has a thickness of about 100 Å, and has a surface density of V-type defects of less than or equal to about $1.8 \times 10^6$ cm$^{-2}$.

15. The light emitting diode of claim 11, further comprising a low-temperature P-type GaN layer between the active layer and the electronic blocking layer.

16. The light emitting diode of claim 15, wherein the electronic blocking layer comprises an non-intentional doping AlGaN layer, a P-type AlGaN layer and a P-AlGaN/GaN superlattice structure layer, successively over the low-temperature P-type GaN layer.

17. The light emitting diode of claim 16, wherein P-type impurity of the P-type AlGaN layer has a higher concentration than P-type impurity of the P-AlGaN/GaN superlattice structure layer.

18. The light emitting diode of claim 16, wherein the P-AlGaN/GaN superlattice structure layer has a higher concentration of Al component than any of the non-intentional doping AlGaN layer and the P-type AlGaN layer.

19. The light emitting diode of claim 18, wherein:
the non-intentional doping AlGaN layer has Al component of about 2-15%;
the P-type AlGaN layer has Al component of about 2-15%; and
the P-AlGaN/GaN superlattice structure layer has Al component of about 2-20%.

20. The light emitting diode of claim 11, wherein the Mg-doped GaN material layer has a Mg impurity concentration of about $2 \times 10^{19}$-$2 \times 10^{20}$ cm$^{-3}$.

* * * * *